US008666082B2

(12) United States Patent
Dreifus et al.

(10) Patent No.: US 8,666,082 B2
(45) Date of Patent: Mar. 4, 2014

(54) UTILIZING INFORMATION FROM A NUMBER OF SENSORS TO SUPPRESS ACOUSTIC NOISE THROUGH AN AUDIO PROCESSING SYSTEM

(75) Inventors: David L Dreifus, Allentown, PA (US); Roger A Fratti, County of Berks, PA (US)

(73) Assignee: LSI Corporation, Milpitas, CA (US)

( * ) Notice: Subject to any disclaimer, the term of this patent is extended or adjusted under 35 U.S.C. 154(b) by 633 days.

(21) Appl. No.: 12/946,877

(22) Filed: Nov. 16, 2010

(65) Prior Publication Data

US 2012/0121097 A1 May 17, 2012

(51) Int. Cl.
*H03G 3/20* (2006.01)

(52) U.S. Cl.
USPC ............ 381/57; 381/92; 381/94.1; 73/514.15

(58) Field of Classification Search
USPC ........ 381/57, 56, 122, 164, 150, 91, 92, 94.1, 381/71.1; 73/514.01, 514.15; 702/54, 141; 324/160
See application file for complete search history.

(56) References Cited

U.S. PATENT DOCUMENTS

| 2003/0040908 | A1 | 2/2003 | Yang et al. |
| 2007/0137462 | A1* | 6/2007 | Barros et al. ..................... 84/453 |
| 2007/0230736 | A1* | 10/2007 | Boesen ......................... 381/380 |
| 2009/0003620 | A1* | 1/2009 | McKillop et al. ............... 381/80 |
| 2010/0103776 | A1 | 4/2010 | Chan |
| 2012/0077503 | A1* | 3/2012 | Kalayjian et al. ............. 455/445 |

* cited by examiner

*Primary Examiner* — Xu Mei
*Assistant Examiner* — Con P Tran
(74) *Attorney, Agent, or Firm* — Raj Abhyanker, P.C.

(57) ABSTRACT

A method includes associating a spatially separate audio sensor and/or a vibration sensor with an audio processing system having one or more audio sensor(s) associated therewith. The spatially separate audio sensor is on a remote location distinct from that of the one or more audio sensor(s). The method also includes capturing information uniquely associated with an external environment of the audio processing system through the spatially separate audio sensor and/or the vibration sensor and the one or more audio sensor(s), and adapting an audio output of the audio processing system based on the captured information uniquely associated with the external environment thereof.

21 Claims, 5 Drawing Sheets

UTILIZING INFORMATION FROM A NUMBER OF SENSORS TO SUPPRESS ACOUSTIC NOISE THROUGH AN AUDIO PROCESSING SYSTEM

FIELD OF TECHNOLOGY

This disclosure relates generally to audio processing systems and, more particularly, to a method, an apparatus and/or a system of utilizing information from a number of sensors to suppress acoustic noise through an audio processing system.

BACKGROUND

An audio processing system (e.g., a mobile phone, cordless phones) may have multiple modes of operation, wherein acoustic signals are routed between a variety of elements such as built-in microphones and speakers. The aforementioned elements may be included in wired or wireless headsets, as well as base stations or cradles having built-in hands-free capability therefor. A user of the audio processing system may switch between the aforementioned elements through, for example, plugging in a headset or powering on a Bluetooth™ headset/earbud.

The audio output of the audio processing system may be sensitive to background noise and, therefore, a variety of techniques are available to characterize the external environment of the audio processing system through grouping (and later, separating) sources associated with the background noise. The aforementioned characterization may be utilized in conjunction with efficient noise cancelation algorithms to suppress acoustic noise through the audio processing system. An audio sensor may be provided in the audio processing system to capture audio signals associated with the background noise. Thus, the capability of the audio processing system to isolate sources of background noise from the audio output thereof may be limited to the capabilities of the audio sensor.

SUMMARY

Disclosed are a method, an apparatus and/or a system of utilizing information from a number of sensors to suppress acoustic noise through an audio processing system.

In one aspect, a method includes associating a spatially separate audio sensor and/or a vibration sensor with an audio processing system having one or more audio sensor(s) associated therewith. The spatially separate audio sensor is on a remote location distinct from that of the one or more audio sensor(s). The method also includes capturing information uniquely associated with an external environment of the audio processing system through the spatially separate audio sensor and/or the vibration sensor and the one or more audio sensor(s), and adapting an audio output of the audio processing system based on the captured information uniquely associated with the external environment thereof.

In another aspect, a method includes associating a spatially separate audio sensor and/or a vibration sensor with an audio processing system having one or more audio sensor(s) associated therewith. The spatially separate audio sensor is on a remote location distinct from that of the one or more audio sensor(s). The method also includes activating the spatially separate audio sensor and/or the vibration sensor and the one or more audio sensor(s) based on a change in an external environment of the audio processing system, and capturing information uniquely associated with the external environment of the audio processing system through the activated spatially separate audio sensor and/or the vibration sensor and the activated one or more audio sensor(s).

In yet another aspect, an audio processing system includes one or more audio sensor(s) and a spatially separate audio sensor and/or a vibration sensor. The spatially separate audio sensor is on a remote location distinct from that of the one or more audio sensor(s). The spatially separate audio sensor and/or the vibration sensor and the one or more audio sensor(s) are configured to capture information uniquely associated with an external environment of the audio processing system. The audio processing system also includes a processor configured to process the captured information uniquely associated with the external environment to enable an appropriate adaptation of an audio output of the audio processing system.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Disclosed are a method, an apparatus and/or a system of utilizing information from a number of sensors to suppress acoustic noise through an audio processing system. Although the present embodiments have been described with reference to specific example embodiments, it will be evident that various modifications and changes may be made to these embodiments without departing from the broader spirit and scope of the various embodiments.

Figure 1:
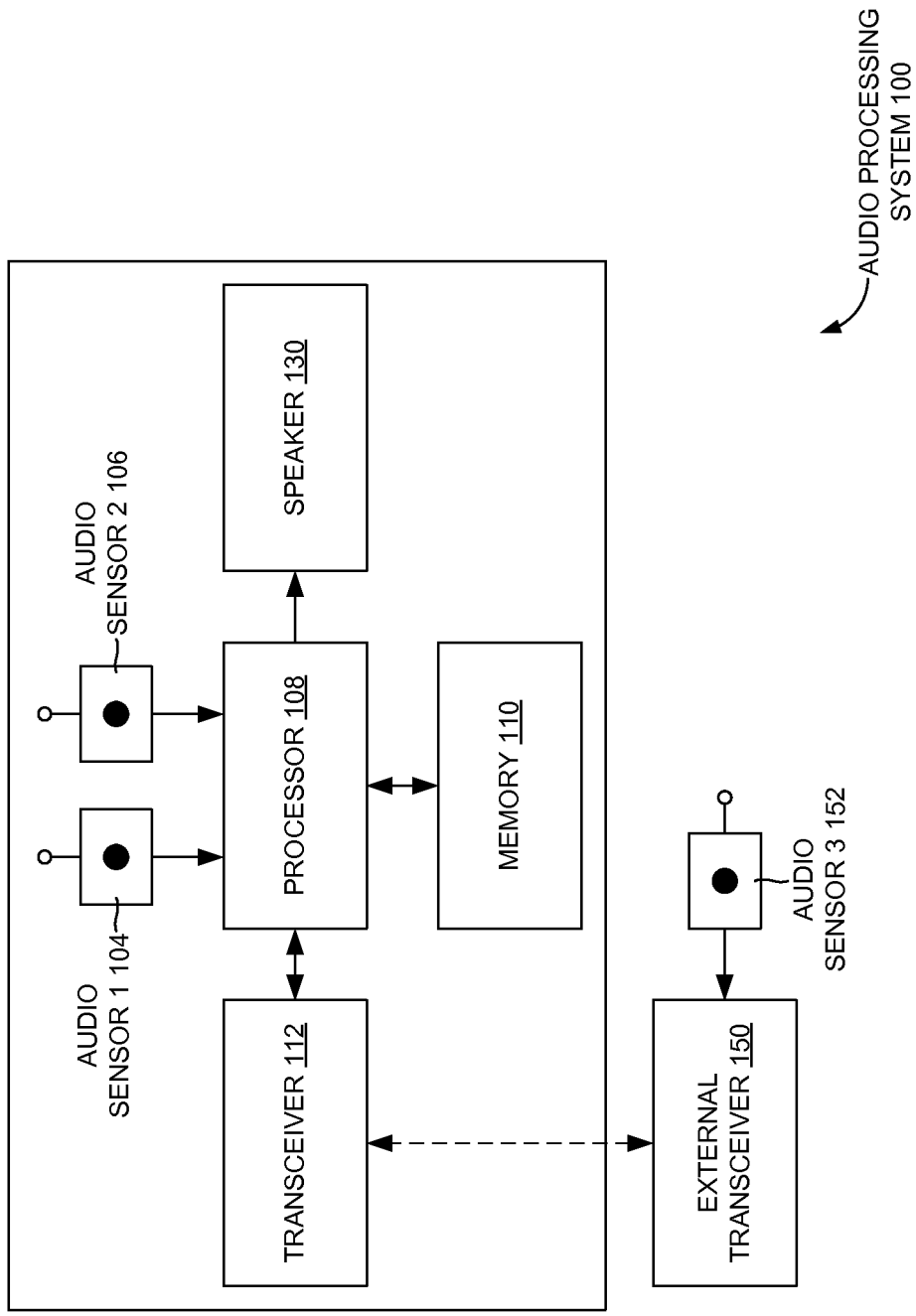
FIG. 1 is a schematic view of an audio processing system, according to one or more embodiments.

FIG. 1 shows an audio processing system 100, according to one or more embodiments. In one or more embodiments, audio processing system 100 may include audio sensor 1 104 and audio sensor 2 106 configured to receive inputs from one or more audio sources (not shown). In one example embodiment, audio processing system 100 may be associated with a mobile phone or a digital phone, and audio sensor 1 104 and audio sensor 2 106 may be microphones configured to capture voice signal(s) of a user thereof and/or an undesired audio source (e.g., source of background noise).

In one or more embodiments, audio sensor 1 104 and audio sensor 2 106 may be interfaced with a processor 108 configured to perform several functions associated with audio processing system 100, as will be discussed below, and to execute a set of instructions (e.g., software, firmware) stored in a memory 110 associated therewith. In one example embodiment, memory 110 may be a part of processor 108. Thus, in one or more embodiments, processor 108 may be configured to process audio signals captured through audio sensor 1 104 and audio sensor 2 106. For example, the processing associated therewith may include analog-to-digital conversion, noise reduction/cancelation and/or amplification. In one or more embodiments, the aforementioned processing may be implemented through hardware, software and/or firmware.

In one or more embodiments, memory 110 may be a volatile memory (e.g., Random Access Memory (RAM)) or a non-volatile memory (e.g., Read-Only Memory (ROM)). In one or more embodiments, processor 108 may include a number of processors associated with one another, each of which is configured to perform one or more functions associated with audio processing system 100. In one or more embodiments, processor 108 may include analog and/or digital circuitry to further process the digitized audio signals configured to be output to speaker(s) 130. It is obvious that a mobile phone associated with audio processing system 100 may include an interface associated with the aforementioned digitized audio signals configured to be output to speaker(s) 130, and that a pair of headphones/earphones may be coupled thereto.

In the example embodiment of FIG. 1, audio processing system 100 may include a transceiver 112 configured to enable reception of audio signals wirelessly from the one or more audio sources. For the aforementioned purpose, audio processing system 100 may include an external transceiver 150 configured to transmit the audio signals wirelessly to transceiver 112, wherein the audio signals are captured through audio sensor 3 152 (see FIG. 1) associated with external transceiver 150. For example, external transceiver 150 may be a Bluetooth™ headset, and transceiver 112 may be an appropriate Bluetooth™ transceiver. In a common scenario involving audio processing system 100, external transceiver 150 may function as a transmitter (e.g., operates in the transmitter mode) and transceiver 112 may function as receiver (e.g., operates in the receiver mode).

It is obvious that external transceiver 150 and transceiver 112 may each include an antenna for the purpose of transmission and/or reception of the audio signals, and that the antenna may be associated with an appropriate matching circuit configured to match the impedance of the antenna with the input impedance of the appropriate transceiver. Circuitry associated with external transceiver 150 and transceiver 112 as wireless transceivers is well known to one skilled in the art. Therefore, discussion associated therewith has been skipped for purposes of convenience, clarity and/or brevity.

Figure 2:
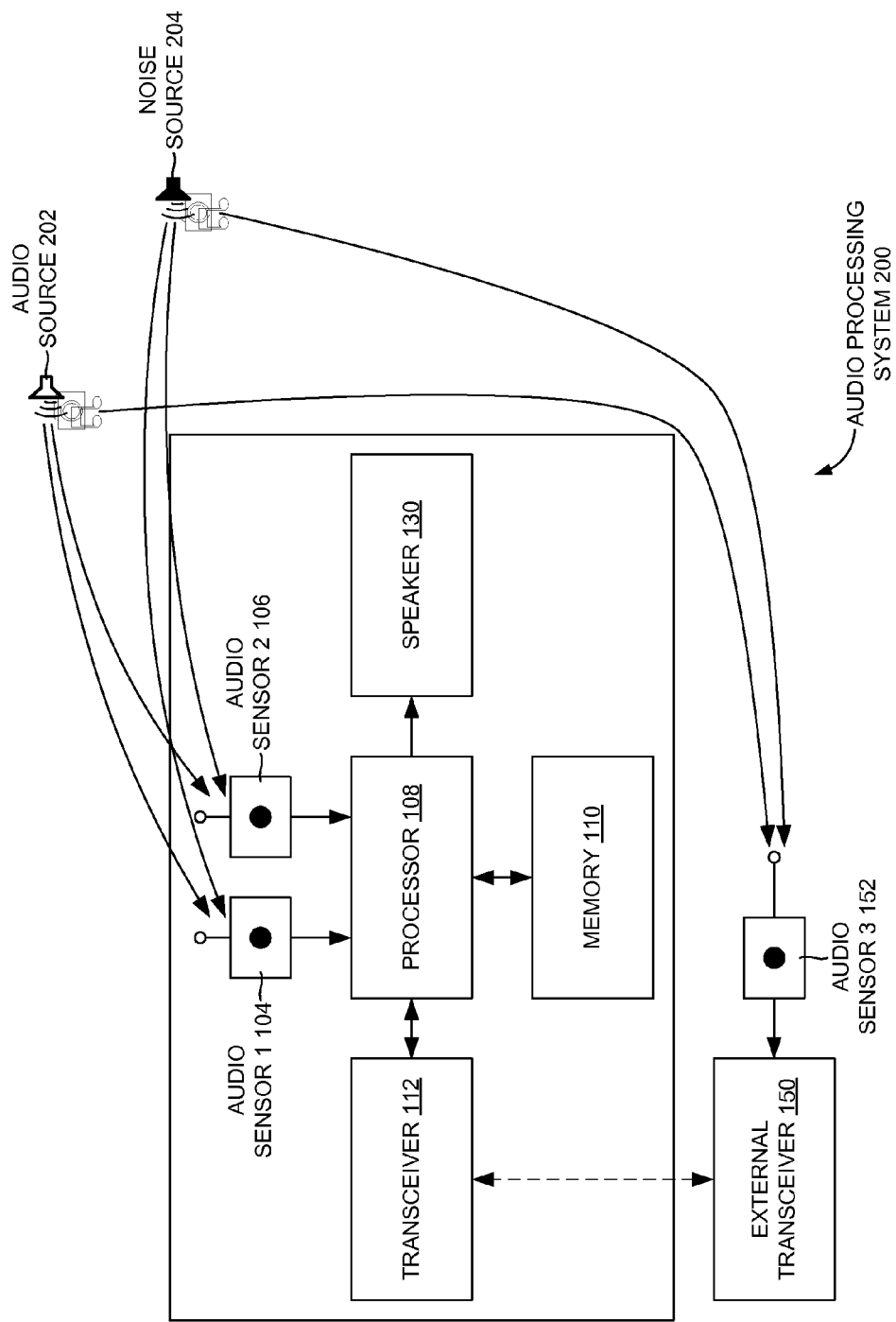
FIG. 2 is a schematic view of the audio processing system of FIG. 1 with audio sources thereof, according to one or more embodiments.

FIG. 2 shows the capturing of audio signals associated with the one or more audio sources (e.g., audio source 202 and noise source 204) through the audio sensors (e.g., audio sensor 1 104, audio sensor 2 106 and audio sensor 3 152) of audio processing system 100 (shown as audio processing system 200 in FIG. 2), according to one or more embodiments. In an example scenario, a user of a mobile phone associated with audio processing system 100 may be driving his/her car on a road, where one or more vehicles other than the car of the user may provide for background noise (e.g., a sudden honking of a truck on the road). The user may be conversing over the mobile phone, thereby serving as audio source 202, and the one or more vehicles may serve as noise source 204. A friend of the user at the other end of the communication may not be able to hear the user due to the audio signal associated with the user being drowned under the background noise.

In another example scenario, the background noise may be associated with a bass drum audible from a location remote from the user. In a noise cancelation technique implemented through processor 108 of audio processing system 100 associated with the mobile phone of the user, the low frequencies associated with the bass drum may be filtered therethrough. However, desirable low frequency speech components associated with the user may also be rejected through audio processing system 100 because of the spectral proximity thereof to the low frequencies associated with the bass drum.

In a reliable noise characterization technique implemented in an audio processing system analogous to audio processing system 100, source separation, identification and/or selection may be employed to distinctly separate audio signals associated with the user and the background noise, to identify the user, the background noise and frequency components thereof, and/or to separate specific frequency components. For example, Audience®'s Fast Cochlea Transform™ (FCT™), implemented in the processor of the audio processing system (e.g., analogous to audio processing system 100) may allow for characterization of various frequency components of the user and the background noise. The frequency components having common attributes associated therewith may be grouped. The auditory streams (e.g., grouped, ungrouped) may be tracked over time to account for persistent and/or recurring audio sources in the environment. An inverse FCT™ may then convert the transformed data associated with audio signals back into the time domain for appropriate processing (e.g., through processor 108 of audio processing system 100).

Thus, utilizing the FCT™, a horn serving as the source of background noise associated with the honking discussed in the abovementioned scenario may be separated from the voice of the user, despite the overlap of spectral components thereof. The source of the background noise may be characterized in terms of attributes such as pitch, space and onset time (e.g., the onset, or, the attack of a signal associated with the background noise), and then "removed" from the audio signal(s) associated with the user.

It is obvious that utilizing FCT™ is merely an example technique, and that other suitable noise characterization algorithms may be utilized in conjunction with a suitable noise cancelation algorithm in order to remove the background noise (an example of signal associated with noise source 204) from the audio signal associated with the user (an example of audio source 202). Processor 108 may be configured to execute instructions of these algorithms.

In an example embodiment discussed above, external transceiver 150 may serve as a Bluetooth™ audio input. Audio sensor 1 104 and audio sensor 2 106 may be provided on a mobile phone including audio processing system 100, and may be appropriately spaced apart in close proximity to each other therein. One or more additional audio sensors (e.g., along one or more sides of mobile phone) may be provided on the mobile phone, and may also be configured to capture audio signals associated with audio source 1 202 and audio source 2 204. Thus, processor 108 may be configured to receive information associated with the audio sources through a number of audio inputs to audio processing system 100.

In one or more embodiments, the sound processing and background noise rejection capability of audio processing system 100 may be extended through a spatially diverse audio sensor 3 150 located remote from audio sensor 1 104 and audio sensor 2 106. For example, audio sensor 1 104 and audio sensor 2 106 may be provided on the mobile phone including audio processing system 100, and audio sensor 3 150 may be provided on a Bluetooth™ headset. When the user of the mobile phone speaks using the Bluetooth™ headset, audio sensor 3 152 may receive audio signals from both the user and the source of the background noise, in addition to audio sensor 1 104 and audio sensor 2 106. It is obvious that audio sensor 1 104 and audio sensor 2 106 may be located farther apart from the mouth of the user than audio sensor 3 152 because the mobile phone may be placed, for example, on the dashboard of the car being driven by the user in order to enjoy the convenience afforded through the Bluetooth™ headset.

The background noise configured to be picked up at each of audio sensor 1 104, audio sensor 2 106 and audio sensor 3 152 may be at a differing level of intensity at audio sensor 3 152 compared to audio sensor 1 104 and audio sensor 2 106. Here, each of audio sensor 1 104, audio sensor 2 106 and audio sensor 3 152 may be in a "far-field" location relative to the background noise. Audio sensor 1 104 and audio sensor 2 106 may be in a "far-field" location relative to the mouth of the user, and audio sensor 3 152 may be in a "near-field" location relative thereto. In the case of the background noise/unwanted signal(s), each of audio sensor 1 104, audio sensor 2 106 and audio sensor 3 152 may be in a "far-field" location relative to the source(s) thereof.

It is obvious that the signal levels (or, signal amplitudes) at different locations are dependent on the frequencies of the audio signals. For example, signals at low frequencies have wavelengths comparable to obstacles encountered in the paths thereof and, therefore, may diffract more efficiently than signals at higher frequencies. Thus, low frequency signals may have higher levels compared to high frequency signals following traversal of the same distance.

In one or more embodiments, the use of audio sensors on different devices may provide for spatial diversity. For example, even when the source of background noise (e.g., noise source 204) is at "far-field" distances relative to the audio sources of the background noise/unwanted signal(s), the signal levels may differ at audio sensor 3 152 and audio sensor 1 104/audio sensor 2 106. Audio sensor 1 104 and audio sensor 2 106 may be provided on a mobile phone including audio processing system 100 and the signal levels associated with the "far-field" noise source 204 may be the same thereat. However, the provision of audio sensor 3 152 on a Bluetooth™ headset may provide for a differing signal level thereat due to the spatial difference in the positioning between audio sensor 3 152 and audio sensor 1 104/audio sensor 2 106.

In one or more embodiments, unwanted signal(s)/background noise associated with noise source 204 may be diffracted through multiple obstacles, which may lead to additional signature characteristics thereof at the audio sensors. For example, in addition to the differing levels of unwanted signal(s)/background noise at, for example, audio sensor 1 104 and audio sensor 3 152, there may be additional differences including but not limited to phase, distortions and time delays therebetween. In one or more embodiments, the spatial diversity afforded thereby may provide for multiple "observations" of the characteristics of the signal(s) associated with noise source 204. Moreover, in one or more embodiments, when audio sensor 1 104/audio sensor 2 106 find picking up characteristics of an example noise source 204 difficult, audio sensor 3 152 may pick up the aforementioned characteristics due to an advantageous spatial location thereof.

It is obvious that other locations of audio sensor 1 104, audio sensor 2 106 and/or audio sensor 3 152 are within the scope of the exemplary embodiments. For example, the user of the mobile phone including audio processing system 100 may converse without using the Bluetooth™ headset and, therefore, audio sensor 1 104 and audio sensor 2 106 may be closer to the mouth of the user compared to audio sensor 3 152. Audio sensor 3 152 may be provided on the Bluetooth™ headset (an example of external transceiver 150), which may still be configured to communicate with transceiver 112. Thus, even though the user communicates through the mobile phone with his/her mouth close to audio sensor 1 104 and audio sensor 2 106, the Bluetooth™ headset serving as audio sensor 3 152 may also be configured to pick up the audio signal(s) associated with the user.

Also, external transceiver 150 is not limited to the Bluetooth™ headset. Audio sensor 3 152 may be a microphone (e.g., hands-free microphone) placed at an appropriate location in the car that the user is driving. Also, audio sensor 1 104 and audio sensor 2 106 may not be limited to being co-located microphones on a mobile phone including audio processing system 100. Audio sensor 1 104, audio sensor 2 106 and audio sensor 3 152 may all be located outside the mobile phone, and may all be in "far-field" locations with regard to noise source 204.

An exemplary Bluetooth™ headset including two or more co-located audio sensors (e.g., one on the mouth-piece and one on the earbud) may not be in "far-field" locations with regard to noise source 204. Thus, a Bluetooth™ headset including two or more co-located audio sensors may not provide for the spatial diversity provided through the exemplary embodiments, where each of one or more audio sensors are provided on different devices (e.g., one or more audio sensors on the mobile phone, one or more audio sensors on the Bluetooth™ headset).

Further, it is obvious that the number of audio sensors on the mobile phone including audio processing system 100 and/or the number of external audio sensors (e.g., audio sensor 3 152) may be varied. The increase in the number of external sensors (e.g., audio sensor 3 152) may lead to increased spatial diversity provided by the sensor system including both the external sensors and the sensors on the mobile phone.

In one or more embodiments, through the utilization of all-acoustic sensors, the acoustic environment associated with a user of, for example, a mobile phone including audio processing system 100 may be statically and/or dynamically characterized and accounted for to enable enhanced audio quality. In one or more embodiments, as discussed above, inputs from multiple acoustic sensors including but not limited to built-in microphones, wired/wireless headset microphones and cradle/base station microphones may be sampled. In one or more embodiments, the acoustic sensors may also include vibration sensors (e.g. accelerometers), as will be discussed below. In one or more embodiments, most of the aforementioned sensors may be bypassed and/or disabled during various modes of operation of a device including audio processing system 100.

Figure 3:
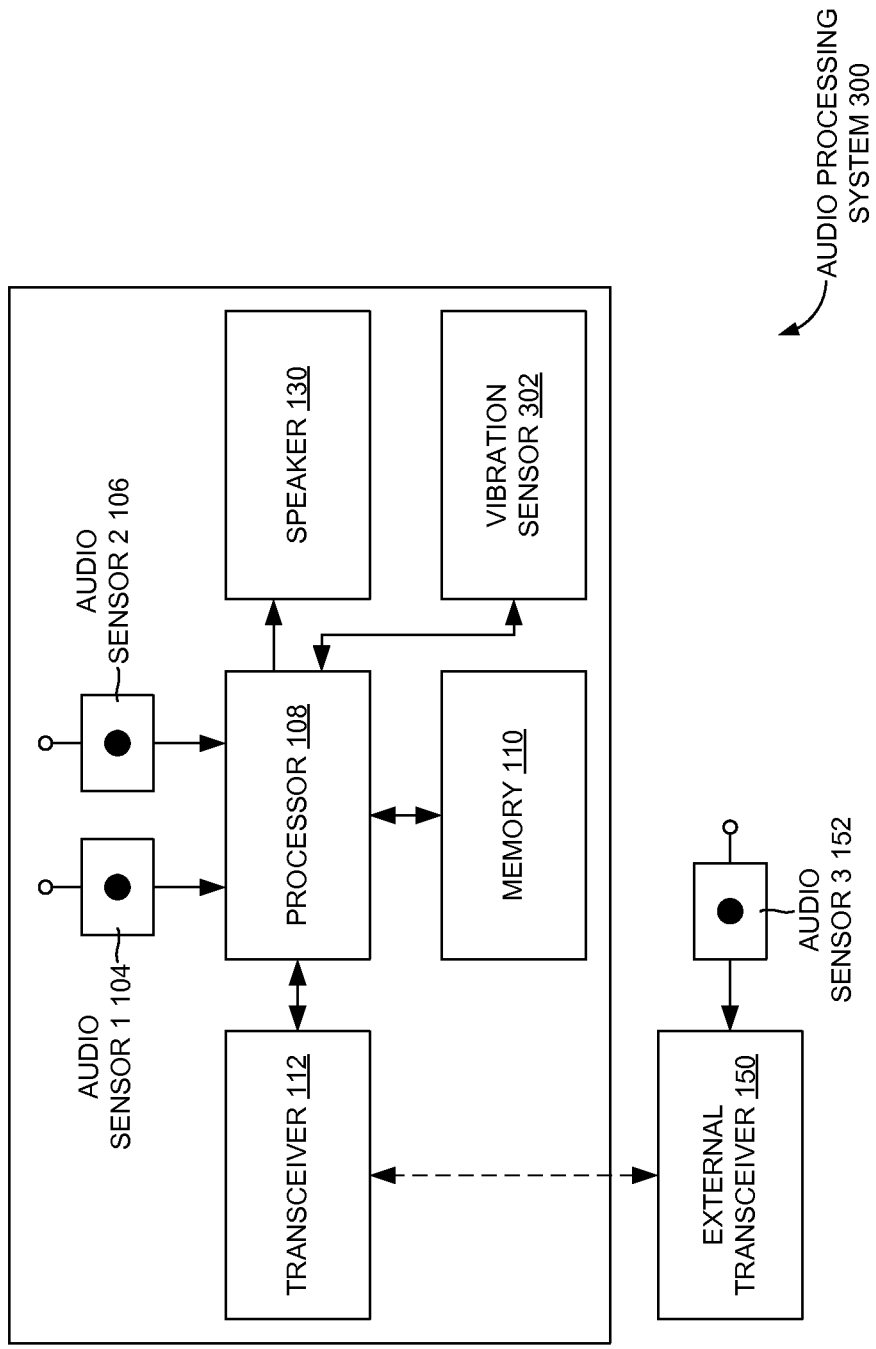
FIG. 3 is a schematic view of an audio processing system including a vibration sensor, according to one or more embodiments.

FIG. 3 shows audio processing system 300, according to one or more embodiments. In one or more embodiments, audio processing system 300 may be analogous to audio processing system 100, except for vibration sensor 302 being interfaced with processor 108. In one or more embodiments, vibration sensor 302 may be configured to measure an external variable (e.g., pressure, strain, force, acceleration)

through the conversion thereof to an electrical signal. For example, vibration sensor 302 may be an accelerometer. In one or more embodiments, audio processing system 300 may/may not include transceiver 112/external transceiver 150/audio sensor 3 152. In one or more embodiments, vibration sensor 302 may be utilized in conjunction with one or more audio sensors (e.g., audio sensor 1 104, audio sensor 2 106) provided on a device (e.g., mobile phone) including audio processing system 300 and/or one or more external audio sensors (e.g., audio sensor 3 152).

In an example scenario, a user of a mobile phone including audio processing system 300 may be driving on a road. When passing by a large truck, vibration sensor 302 (e.g., accelerometer) may be configured to pick up vibrations associated with the truck such that audio levels associated with the user may temporarily be increased through audio processing system 300. Processor 108 may perform the appropriate operations required to detect the presence of the truck and may initiate the increase of the signal level of the user in order to enable, for example, a friend of the user participating in a conversation with the user to distinctly hear the user.

Alternately, processor 108 may be associated with the friend of the user and may be configured to initiate the increase of the signal level of the friend of the user in order for the user to be able to distinctly hear the friend when the environment of the friend includes one or more active noise source(s). Further, the mobile phone of the user including an audio processing system analogous to audio processing system 300 may be configured to detect the increased signal level (e.g., based on a threshold value of the signal level(s) received) of the friend, and processor 108 may be configured to increase the signal level of the user. Thus, both the signal level of the user and the signal level of the friend may be increased. Even when the signal level of the friend is not increased, processor 108 associated with the user may be configured to detect signals associated with the one or more noise source(s) in the environment of the friend upon reception thereof, and may initiate an increase in the signal level of the user. Therefore, the friend may be able to distinctly hear the user, despite having one or more active noise source(s) in the environment thereof.

It is obvious that other detection mechanisms may be employed to increase signal levels associated with the user and/or another participant in a conversation therewith. All detection mechanisms exploiting the spatial diversity described above and/or the vibration sensor are within the scope of the exemplary embodiments.

The low frequency rumble associated with a passing vehicle may be accounted for to improve signal quality through audio processing system 300. In another example scenario, a user of a mobile phone may hit a pothole when driving his/her car. The act may cause a loud bang having a low frequency signal content associated therewith. Vibration sensor 302 (e.g., accelerometer) may pick up the aforementioned signal content, which may then be utilized by processor 108 for noise cancelation purposes. Thus, in one or more embodiments, noise source 204 may not be limited to acoustic energy propagating through air into the audio sensor(s).

In one or more embodiments, in addition to utilizing additional audio sensors (e.g., microphones) for improved spatial separation, the inherent frequency selection difference between the audio sensors may be exploited during characterization of the noise components in processor 108. In one or more embodiments, the bandwidth of the inputs of the one or more audio sensors may be dynamically changed to account for different noise environments. For example, when a mobile phone including audio processing system 300 is utilized in a factory setting with high frequency whining in the background, audio processing system 300 may be configured to adapt the selectivity or the bandwidth of the multiple sampling systems (e.g., audio sensors) to ease post-processing requirements associated with one or more sources of the background noise/unwanted signal(s) (e.g., noise source 204). In one or more embodiments, the aforementioned adaptability may provide for power savings associated with processing (e.g., through processor 108) through audio processing system 100/audio processing system 300. In one or more embodiments, the user may change the selectivity or the bandwidth of the multiple sampling systems.

In one or more embodiments, through appropriate settings and/or user interface(s), the desired audio quality may be determined during operation of, for example, a mobile phone including audio processing system 100/audio processing system 300. In one or more embodiments, processor 108 may be configured to determine/detect all acoustic inputs and outputs thereof during start-up of, for example, the mobile phone including audio processing system 100/audio processing system 300 and/or during configuration changes such as the powering up of external transceiver 150 (e.g., Bluetooth™ headset) and the docking/undocking of the mobile phone from a base or a cradle.

In one or more embodiments, directly attached and/or multiplexed (and sampled) acoustic signals from the multiple inputs may be utilized to determine the one or more audio sensors to be activated in order to provide for audio enhancement, noise suppression and/or cancelation. In one or more embodiments, the aforementioned determination may be dynamically performed depending on changes in the background noise. In one or more embodiments, processor 108 of audio processing system 100/audio processing system 300 may be configured to characterize the environment of a user thereof on a periodic basis. Thus, in one or more embodiments, the determination of the one or more audio sensor(s)/vibration sensor to be activated may be performed through time-sampling the audio/noise source(s) in the environment of the user. A mobile phone including audio processing system 100/audio processing system 300 may include a wired headset and a built-in microphone associated therewith. The sensor system therein may be utilized to provide spatial diversity in order to isolate one or more noise sources (e.g., noise source 204).

In one or more embodiments, depending on a time of arrival of audio signal(s) associated with the one or more noise source(s) in the environment of a user of audio processing system 100/audio processing system 300 at the audio sensor(s) associated therewith, one or more audio sensor(s) may be appropriately activated and/or positionally adjusted. In one or more embodiments, the external shape and/or the dimension(s) of the one or more audio sensor(s) may also be modified to modify the directional response thereof. Thus, although the environment of the user may not be modified, the one or more audio sensor(s) may be modified to enable audio "beam steering."

Although a mobile phone has been consistently shown as an example device associated with audio processing system (100, 200, 300), audio processing system (100, 200, 300) may be associated with other audio input devices configured to receive audio signals such as video games, reporting systems, personal digital assistants (PDAs) etc.

Figure 4:
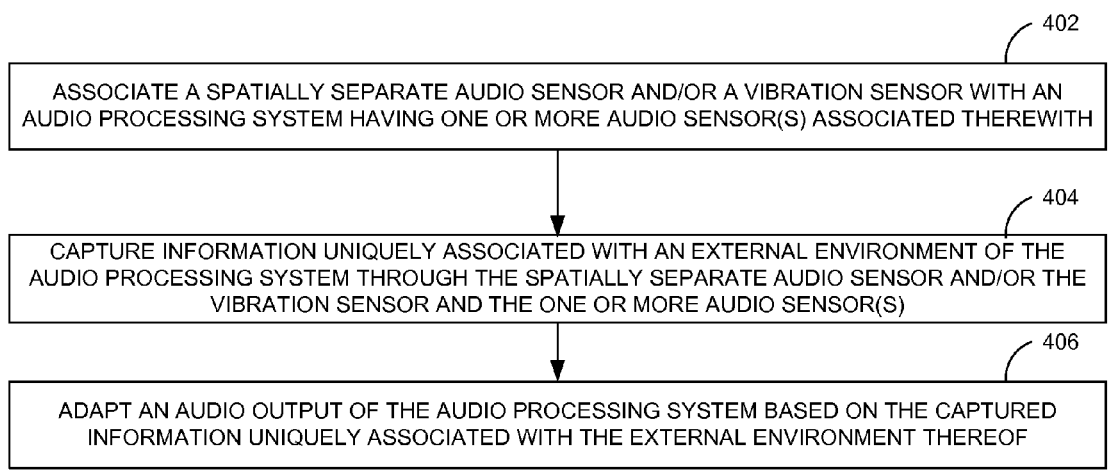
FIG. 4 is a process flow diagram detailing the operations involved in a method of adapting an audio output of an audio processing system based on an external environment thereof, according to one or more embodiments.

FIG. 4 shows a process flow diagram detailing the operations involved in a method of adapting an audio output of an audio processing system (e.g., audio processing system 100/200/300) based on an external environment thereof. In one or more embodiments, operation 402 may involve associating a spatially separate audio sensor (e.g., audio sensor 3 152) and/or a vibration sensor (e.g., vibration sensor 302) with the audio processing system (e.g., audio processing system 100/200/300) having one or more audio sensor(s) (e.g., audio sensor 1 104, audio sensor 2 106) associated therewith. In one or more embodiments, the spatially separate audio sensor is on a remote location distinct from that of the one or more audio sensor(s).

In one or more embodiments, operation 404 may involve capturing information uniquely associated with an external environment of the audio processing system through the spatially separate audio sensor and/or the vibration sensor and the one or more audio sensor(s). In one or more embodiments, operation 406 may involve adapting an audio output of the audio processing system based on the captured information uniquely associated with the external environment thereof.

Figure 5:
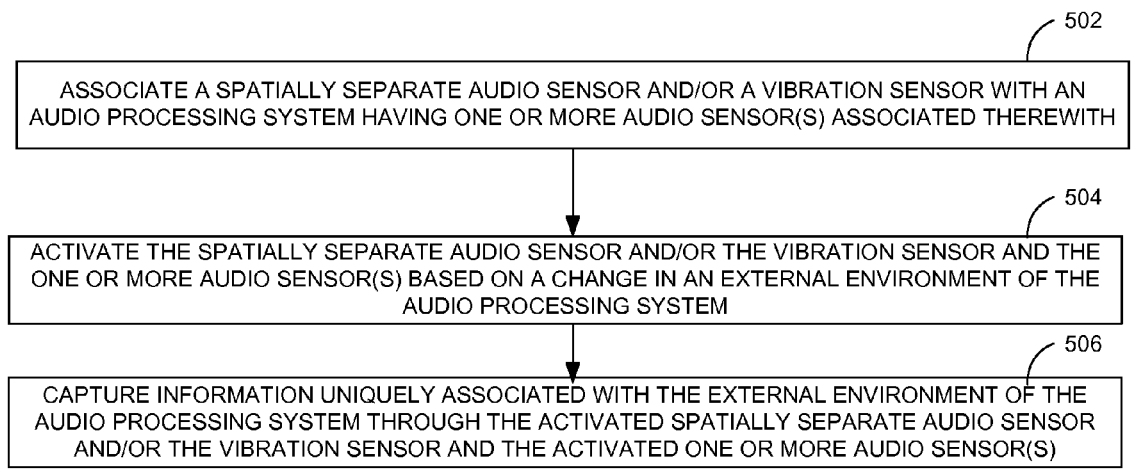
FIG. 5 is a process flow diagram detailing the operations involved in a method of utilizing information from a number of sensors to suppress acoustic noise through an audio processing system, according to one or more embodiments.

FIG. 5 shows a process flow diagram detailing the operations involved in a method of utilizing information from a number of sensors to suppress acoustic noise through an audio processing system (e.g., audio processing system 100/200/300). In one or more embodiments, operation 502 may involve associating a spatially separate audio sensor (e.g., audio sensor 3 152) and/or a vibration sensor (e.g., vibration sensor 302) with the audio processing system (e.g., audio processing system 100/200/300) having one or more audio sensor(s) (e.g., audio sensor 1 104, audio sensor 2 106) associated therewith. In one or more embodiments, the spatially separate audio sensor is on a remote location distinct from that of the one or more audio sensor(s).

In one or more embodiments, operation 504 may involve activating the spatially separate audio sensor and/or the vibration sensor and the one or more audio sensor(s) based on a change in an external environment of the audio processing system. In one or more embodiments, operation 506 may involve capturing information uniquely associated with the external environment of the audio processing system through the activated spatially separate audio sensor and/or the vibration sensor and the activated one or more audio sensor(s).

Although the present embodiments have been described with reference to specific example embodiments, it will be evident that various modifications and changes may be made to these embodiments without departing from the broader spirit and scope of the various embodiments. Also, for example, the various devices and modules described herein may be enabled and operated using hardware circuitry (e.g., CMOS based logic circuitry), firmware, software or any combination of hardware, firmware, and software (e.g., embodied in a machine readable medium).

In addition, it will be appreciated that the various operations, processes, and methods disclosed herein may be embodied in a machine-readable medium and/or a machine accessible medium compatible with a data processing system (e.g., a computer devices), and may be performed in any order (e.g., including using means for achieving the various operations). Accordingly, the specification and drawings are to be regarded in an illustrative rather than a restrictive sense.

What is claimed is:

1. A method comprising:
    associating at least one of a spatially separate audio sensor and a vibration sensor with an audio processing system having at least one audio sensor associated therewith, the spatially separate audio sensor being on a remote location distinct from that of the at least one audio sensor;
    capturing information uniquely associated with an external environment of the audio processing system through the at least one of the spatially separate audio sensor and the vibration sensor and the at least one audio sensor;
    adapting an audio output of the audio processing system based on the captured information uniquely associated with the external environment thereof; and
    characterizing the external environment of the audio processing system through a processor of the audio processing system such that at least one unwanted signal source is isolated from a desired audio source associated with the audio processing system,
    wherein when there are a plurality of unwanted signal sources captured through the at least one of the spatially separate audio sensor and the vibration sensor and the at least one audio sensor, each of the plurality of unwanted signal sources are isolated from one another during the characterization of the external environment.

2. The method of claim 1, wherein adapting the audio output of the audio processing system based on the captured information uniquely associated with the external environment thereof comprises increasing a signal level associated with the audio output based on a captured vibration information associated with the external environment.

3. The method of claim 2, further comprising:
    canceling an unwanted signal associated with a noise source in the external environment from the audio output.

4. The method of claim 1, wherein the vibration sensor is an accelerometer.

5. The method of claim 1,
    wherein one of the spatially separate audio sensor and the at least one audio sensor is configured to be associated with a Bluetooth transceiver external to the audio processing system.

6. The method of claim 5, wherein the audio processing system comprises an appropriate Bluetooth transceiver configured to receive information from the external Bluetooth transceiver.

7. The method of claim 1, further comprising:
    detecting a presence of at least one of the at least one of the spatially separate audio sensor and the vibration sensor and the at least one audio sensor during at least one of a start-up of a device including the audio processing system and a configuration change associated with the device including the audio processing system; and
    activating at least one of the at least one of the spatially separate audio sensor and the vibration sensor and the at least one audio sensor based on a change in the external environment.

8. The method of claim 7, wherein the at least one of the spatially separate audio sensor and the vibration sensor and the at least one audio sensor are one of:
    built into the device including the audio processing system,
    associated with one of a wired headset microphone, a wireless headset microphone and a hands-free microphone, and
    associated with a microphone provided on another device associated with the device including the audio processing system.

9. The method of claim 1, wherein characterizing the external environment of the audio processing system further comprises at least one of:
    utilizing an inherent frequency selection difference between the spatially separate audio sensor and the at least one audio sensor therefor;
    modifying a bandwidth of at least one of the spatially separate audio sensor and the at least one audio sensor therefor; and modifying at least one of a shape, a dimension and a position of the at least one of the spatially separate audio sensor and the at least one audio sensor therefor.

10. A method comprising:
associating at least one of a spatially separate audio sensor and a vibration sensor with an audio processing system having at least one audio sensor associated therewith, the spatially separate audio sensor being on a remote location distinct from that of the at least one audio sensor;
activating the at least one of the spatially separate audio sensor and the vibration sensor and the at least one audio sensor based on a change in an external environment of the audio processing system;
capturing information uniquely associated with the external environment of the audio processing system through the activated at least one of the spatially separate audio sensor and the vibration sensor and the activated at least one audio sensor; and
characterizing the external environment of the audio processing system through a processor of the audio processing system such that at least one unwanted signal source is isolated from a desired audio source associated with the audio processing system,
wherein when there are a plurality of unwanted signal sources captured through the activated at least one of the spatially separate audio sensor and the vibration sensor and the activated at least one audio sensor, each of the plurality of unwanted signal sources are isolated from one another during the characterization of the external environment.

11. The method of claim 10, further comprising adapting an audio output of the audio processing system based on the captured information uniquely associated with the external environment thereof.

12. The method of claim 10, wherein adapting the audio output of the audio processing system based on the captured information uniquely associated with the external environment thereof comprises increasing a signal level associated with the audio output based on a captured vibration information associated with the external environment.

13. The method of claim 12, further comprising:
canceling an unwanted signal associated with a noise source in the external environment from the audio output.

14. The method of claim 10, wherein the at least one of the spatially separate audio sensor and the vibration sensor and the at least one audio sensor are one of:
built into a device including the audio processing system,
associated with one of a wired headset microphone, a wireless headset microphone and a hands-free microphone, and
associated with a microphone provided on another device associated with the device including the audio processing system.

15. An audio processing system comprising:
at least one audio sensor;
at least one of a spatially separate audio sensor and a vibration sensor, the spatially separate audio sensor being on a remote location distinct from that of the at least one audio sensor, and the at least one of the spatially separate audio sensor and the vibration sensor and the at least one audio sensor being configured to capture information uniquely associated with an external environment of the audio processing system; and
a processor configured to process the captured information uniquely associated with the external environment to enable an appropriate adaptation of an audio output of the audio processing system,
wherein the processor is further configured to characterize the external environment such that at least one unwanted signal source is isolated from a desired audio source associated with the audio processing system, and
wherein when there are a plurality of unwanted signal sources captured through the at least one of the spatially separate audio sensor and the vibration sensor and the at least one audio sensor, the processor is configured to isolate each of the plurality of unwanted signal sources from one another during the characterization of the external environment.

16. The audio processing system of claim 15, wherein the processor is configured to enable adaptation of the audio output of the audio processing system through increasing a signal level associated with the audio output based on a captured vibration information associated with the external environment.

17. The audio processing system of claim 16, wherein the processor is further configured to enable
canceling of an unwanted signal associated with a noise source in the external environment from the audio output.

18. The audio processing system of claim 15, wherein the vibration sensor is an accelerometer.

19. The audio processing system of claim 15,
wherein one of the spatially separate audio sensor and the at least one audio sensor is configured to be associated with a Bluetooth transceiver external to the audio processing system.

20. The audio processing system of claim 19, wherein the audio processing system further comprises an appropriate Bluetooth transceiver configured to receive information from the external Bluetooth transceiver.

21. The audio processing system of claim 15, wherein the at least one of the spatially separate audio sensor and the vibration sensor and the at least one audio sensor are one of:
built into a device including the audio processing system,
associated with one of a wired headset microphone, a wireless headset microphone and a hands-free microphone, and
associated with a microphone provided on another device associated with the device including the audio processing system.

\* \* \* \* \*